United States Patent [19]

Martinez

[11] Patent Number: 4,498,146
[45] Date of Patent: Feb. 5, 1985

[54] MANAGEMENT OF DEFECTS IN STORAGE MEDIA

[75] Inventor: Maria N. Martinez, Prestbury, Ill.

[73] Assignee: AT&T Bell Laboratories, Murray Hill, N.J.

[21] Appl. No.: 403,776

[22] Filed: Jul. 30, 1982

[51] Int. Cl.³ .............................................. G06F 13/00
[52] U.S. Cl. ...................................................... 364/900
[58] Field of Search ... 364/200 MS File, 900 MS File; 371/10, 11; 365/200

[56] References Cited

U.S. PATENT DOCUMENTS

| 3,331,058 | 7/1967 | Perkins | 364/200 |
|---|---|---|---|
| 3,771,143 | 11/1973 | Taylor | 364/200 |
| 3,949,380 | 4/1976 | Barbour | 364/200 |
| 3,983,537 | 9/1976 | Parsons et al. | 364/200 |
| 4,051,354 | 9/1977 | Choate | 371/10 |
| 4,051,460 | 9/1977 | Yamada et al. | 364/900 |
| 4,310,901 | 1/1982 | Harding et al. | 365/200 |
| 4,346,459 | 8/1982 | Sud et al. | 365/200 |
| 4,380,066 | 4/1983 | Spencer et al. | 371/10 |
| 4,405,952 | 9/1983 | Slakmon | 360/49 |
| 4,420,807 | 12/1983 | Nolta et al. | 364/200 |

FOREIGN PATENT DOCUMENTS 2426938  5/1978  France .................................. 360/49

OTHER PUBLICATIONS

*IBM Technical Disclosure Bulletin*, vol. 20, No. 5, Oct. 1977, New York (US), Sakalay: "Address Skip—A Means for Utilizing Imperfect Storage", pp. 1841-1842.
*IBM Technical Disclosure Bulletin*, vol. 24, No. 1B, Jun. 1981, New York (US), A. Ganguly and B. Spaeth: "Increased Direct-Access Storage Device Yield through Defective Track Handling in Hardware", pp. 625-627.
*IBM Technical Disclosure Bulletin*, vol. 12, No. 9, Feb. 1970, New York (US), Smith: "Substitute Memory Location Assignment for Faulty Locations", pp. 1441-1442.
*IBM Technical Disclosure Bulletin*, vol. 17, No. 10, Mar. 1975, New York (US), R. Abrahamsen: "Dynamic Redundancy and Repair System for Large Mass Storage Unit", pp. 2841-2843.

*Primary Examiner*—Raulfe B. Zache
*Attorney, Agent, or Firm*—D. Volejnicek; P. Visserman

[57] ABSTRACT

Disclosed is a method and apparatus for avoiding accessing of defective locations in disks and other storage media. A disk file controller uses manufacturer-provided information about the location of defects to construct a sequentially ordered list of addresses of defective storage locations in the disk, and the list is stored in a table in the disk. During use of the disk, the disk file controller reads the table of defects into its memory and uses it to translate virtual addresses into real addresses. The translation process skips over real addresses of defective locations. The virtual address is translated into a real address by being incremented by the number of defects whose addresses are lower than the real address. Subsequent contiguous virtual addresses are translated into real addresses by being incremented by the number of contiguous defective locations that follow the location associated with the preceding virtual address. Addresses of new defects found during use of the disk are stored by the disk file controller in temporary storage on the disk and are incorporated into the defect table when the disk is taken out of service.

55 Claims, 10 Drawing Figures

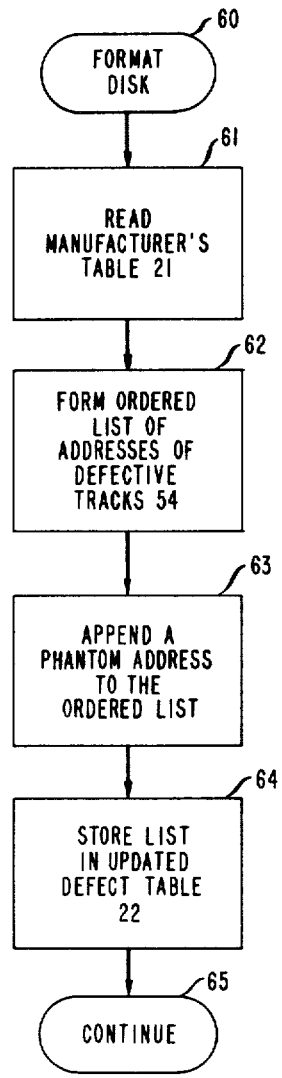
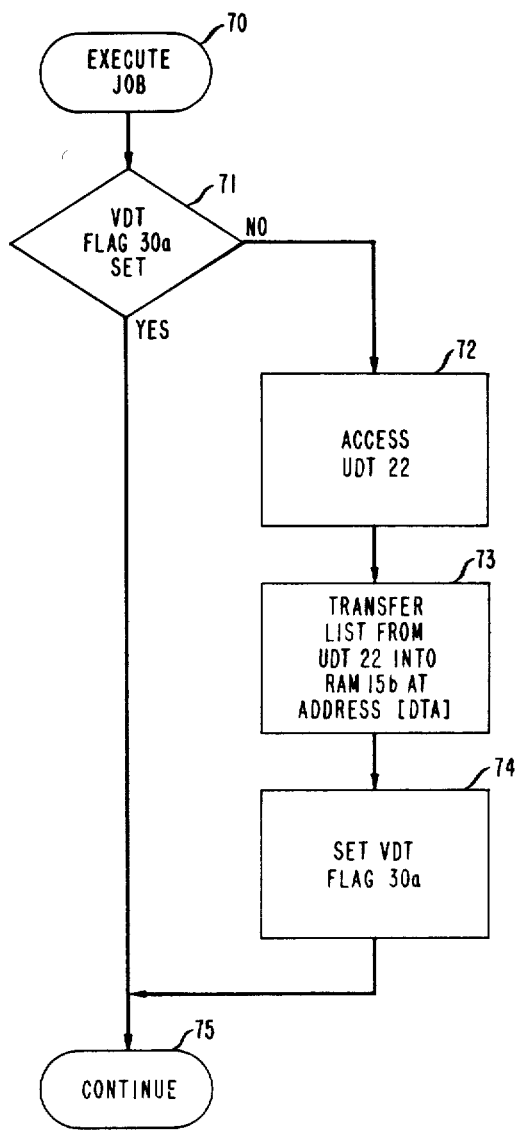

MANAGEMENT OF DEFECTS IN STORAGE MEDIA

TECHNICAL FIELD

This invention relates to information storage systems, and in particular to the management of storage media defects in such systems.

BACKGROUND OF THE INVENTION

Media utilized for storage of information in data processing, computing, and other electronic systems represent diverse technologies and take on many forms. Familiar examples of such devices are semiconductor memories and magnetic disks and tapes. However, the media have a common characteristic, in that an increase in their storage capacity per unit of area commonly increases the occurrence of defects in the media. Defects are flaws in the media that make one or more portions of the media unsuitable for information storage. Defects are commonly the result of the presence of dust particles and other aberrations in the disk manufacturing process.

As the storage capability of bulk storage media is increased, it becomes more difficult and more expensive to manufacture flawless storage devices, and it becomes very costly to have to scrap all of the flawed devices. Consequently, schemes are needed that permit the utilization of flawed storage media.

To achieve this end, it is common to reserve a predetermined area of the storage medium to act as a spare that can substitute for defective areas of the medium. In the prior art schemes the manufacturer may substitute the spare storage areas for the defective areas fixedly and unchangeably, for example, by breaking the appropriate electrical connections in semiconductor memory chips. This type of substitution has the disadvantage that newly occurring or discovered defects in the medium cannot be compensated. As a result of these new defects, the medium may again become unutilizable.

Instead of making a fixed substitution of spare storage for defective storage, the manufacturer may merely flag defects in the medium and thereby redirect users to the area of spare storage that is substituting for the defective area. For example, in a magnetic disk or tape, a flag may be recorded at the defect, or at the beginning of a quantized portion of storage that includes the defect, which flag indicates the location of the defect and either implicitly or explicitly specifies the address of the storage which is substituting for the defective storage. A disadvantage of this approach is that it degrades the performance potential of an information storage system, because provision must be made for the significant time delay involved in twice accessing the medium to arrive at the desired storage location: firstly accessing the desired storage location, only to find it flagged as defective, and secondly accessing the spare storage location which is substituting for the defective location.

SUMMARY OF THE INVENTION

The present invention is directed to alleviating these and other disadvantages of the prior art storage media defect management schemes.

The invention is a novel scheme of avoiding accessing of defective locations in storage media. If a table of addresses of defective locations is not associated with the storage medium, one is first constructed. When an address is obtained for accessing a location in the storage medium, contents of the table are read to determine if access to the media will be impacted by defective locations, and the address is modified to compensate for the impact of defective locations. The storage location designated by the modified address is then accessed. If none of the defective locations impact the access, the storage location designated by the obtained address is accessed. The above activities are carried out during execution of the job for whose execution the address was obtained.

Preferably, the table comprises an ordered list of the addresses of defective locations. The obtained address is a virtual address, while the modified address is a real address. Contents of the table are read to determine the number of defective locations that impact the access, and the virtual address is translated into the real address by using the determined number of defective locations in the translation.

Advantageously, to construct the table, the addresses of the defective locations are determined and stored in a memory, preferably a rapidly accessible memory.

Furthermore, the scheme advantageously provides for updating the table with addresses of new defects.

The inventive scheme avoids the degradation in system performance which is suffered by the prior art schemes as a consequence of having to access the medium twice to arrive at the desired storage location. Requiring little or no system hardware modification and support, the inventive scheme is relatively simple to implement and maintain and is suited for retrofitting into many existing storage media management systems. Furthermore, the inventive scheme also provides sufficient flexibility to accommodate newly occurring or discovered defects in the medium.

These and other advantages of the present invention will become more apparent from the following description of an illustrative embodiment of the invention considered together with the drawing.

BRIEF DESCRIPTION OF THE DRAWING

FIG. 5 is a flowchart of a portion of a disk formatting routine of the disk file controller (DFC) processor of FIG. 1;

FIG. 6 is a flowchart of a table creation routine of the DFC processor of FIG. 1;

DETAILED DESCRIPTION

Figure 1:
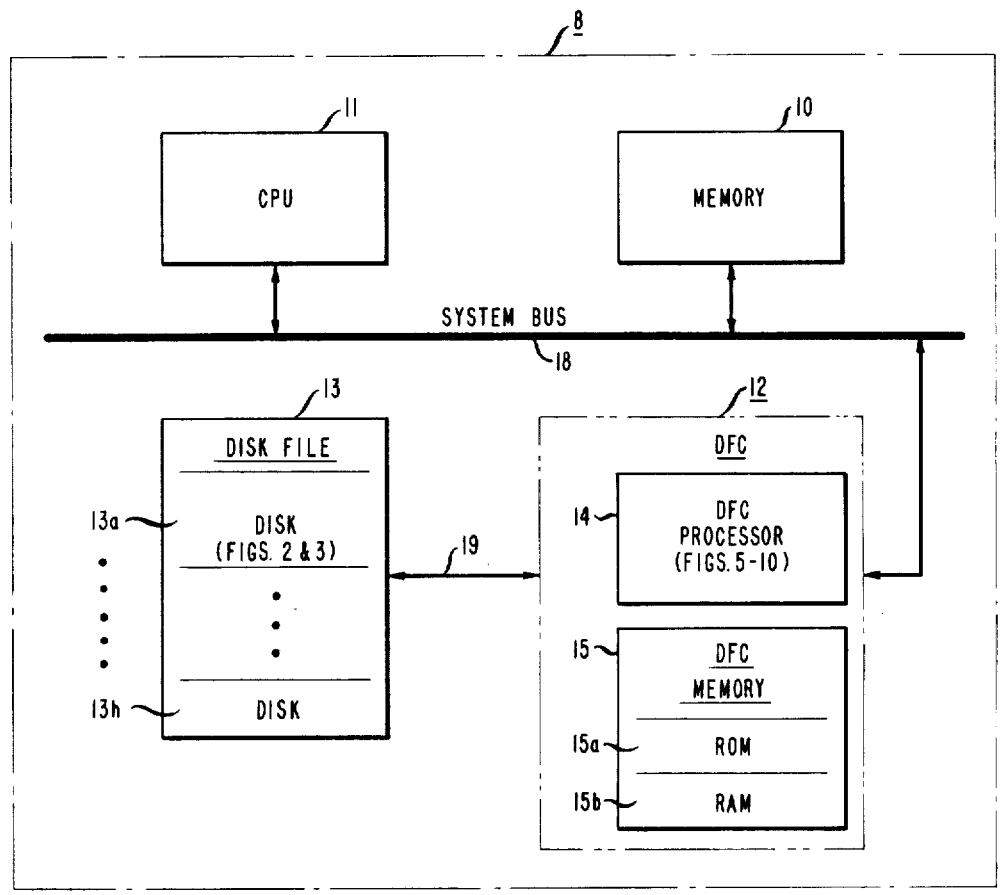
FIG. 1 is a block diagram of a computer system which includes an illustrative embodiment of the invention.

Turning now to the drawing, FIG. 1 shows a representative computer system 8 used to illustrate the principles of the invention. The system 8 includes a central processing unit (CPU) 11 which performs calculations, logical operations, and other data manipulation activities of the system 8. The CPU 11 operates under program control. The CPU 11 may be any one of a number of commercially available programmable machines adapted to communicate with a known memory 10 and a disk file 13 via a system bus 18. Portions of the program and some of the data required by the CPU 11 for its operation are stored in the memory 10, from where they are rapidly available to the CPU 11. Other portions of the program and the vast majority of the data are stored in the disk file 13.

The disk file 13 is a mass storage medium. It has a much greater storage capacity than the memory 10, but storage therein and retrieval therefrom of information is generally much slower than is the case with the memory 10. Control of the operations of the disk file 13 and of its interaction with other portions of the system 8 is provided by a disk file controller (DFC) 12. The DFC 12 interfaces the disk file 13 to the system bus 18, which serves as a communication medium of the system 8.

The CPU 11, the memory 10, and the DFC 12 are connected to the bus 18, and the CPU 11, the memory 10, and the DFC 12 communicate with each other over the bus 18 in a conventional manner. The details of their interaction and the protocol of their communications are largely a function of the structure of the bus 18 and are not important for an understanding of this invention. They lie well within the skill of the art.

The DFC 12 may be any suitable commercially available unit. The DFC 12 operates in a conventional manner, with exceptions that are explained further below. Inter alia, the DFC 12 includes a DFC processor 14 and a DFC memory 15. The DFC processor 14 initiates and responds to signaling that makes up the communication protocol of the bus 18 and actively controls the operation of the disk file 13, including the accessing of storage locations therein for purposes of writing information into or reading information out of those locations. The DFC memory 15 is a rapidly accessible memory. The time for access by the DFC processor 14 of a memory location in the DFC memory 15 is significantly lower than its time for access of a memory location in the disk file 13. The DFC memory 15 is comprised of two portions: a readable and writable, random access, memory (RAM) 15b and a readable-only memory (ROM) 15a. The DFC ROM 15a holds the program under whose control the DFC processor 14 operates. The program includes the various routines, flowcharted in FIGS. 5-10, that the DFC processor 14 executes. The DFC RAM 15b holds the data required by the DFC processor 14 for operation, and also provides buffer storage for information being transferred between the disk file 13 and the system bus 18.

The disk file 13 is comprised of one or more disks. In the example of FIG. 1, the disk file 13 includes up to eight disks 13a-13h. The disks 13a through 13h may be conventional commercially available units. Each disk 13a through 13h operates independently of the others. The disks 13a through 13h are substantially the same, and therefore only one, the disk 13a, will be discussed in more detail, with the understanding that the discussion pertains to the disks 13b through 13h as well.

Figure 2:
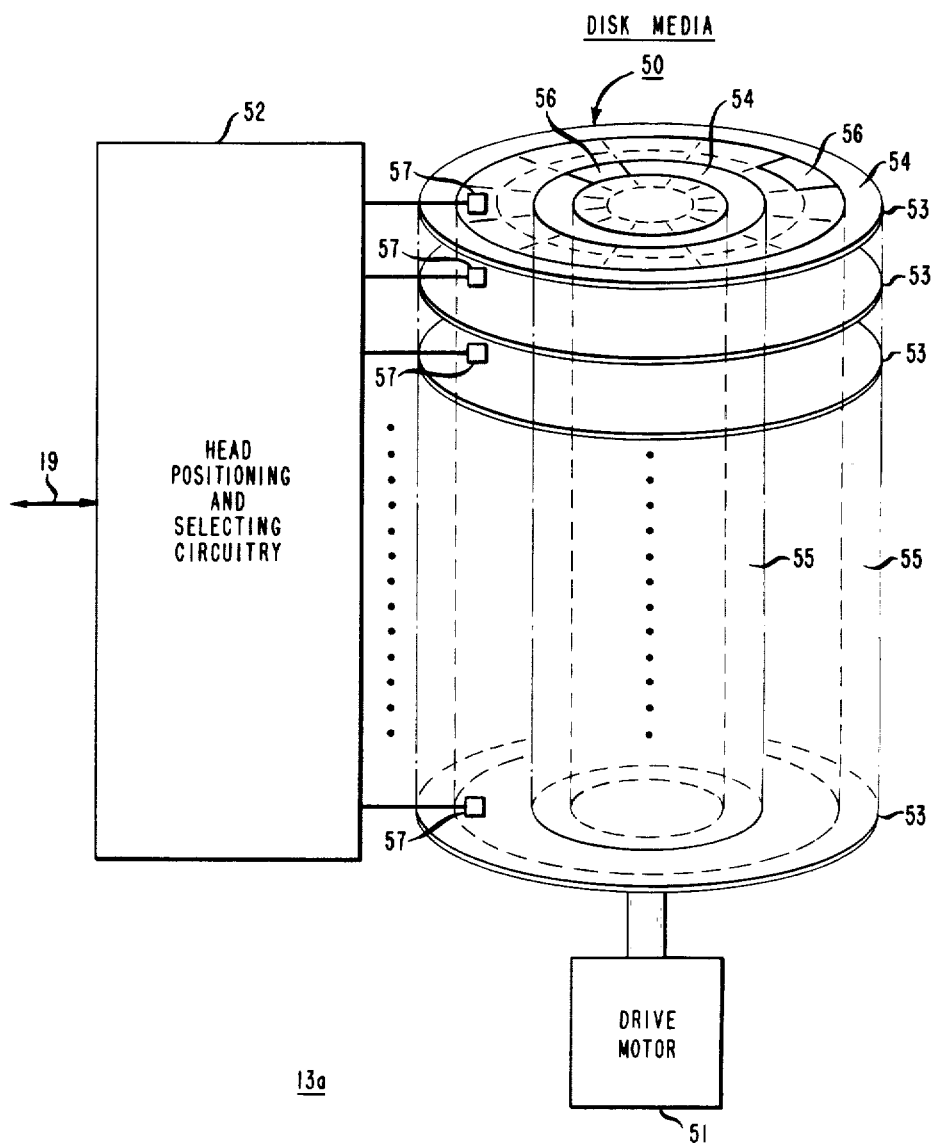
FIG. 2 is a block diagram of a disk of FIG. 1.

The disk 13a is diagramed in block form in FIG. 2. As shown there, the disk 13a includes disk media 50 which serve as the magnetic information storage media. A drive motor 51 constantly spins the disk media 50 past read and write heads 57 which are utilized for accessing selected portions of the disk media 50 for purposes of information storage and retrieval. Motion of the heads 57 and selection of one or more particular heads are performed by head positioning and selecting circuitry 52, which operates under control of commands received from the DFC 12 over a data and control bus 19. Signaling from the circuitry 52 to the DFC 12 and data passing between the disk 13a and the DFC 12 likewise pass over the bus 19.

As is further shown in FIG. 2, the disk media 50 are comprised of a plurality of disk plates 53. Each plate 53 has one head 57 associated therewith. Each plate 53 has its surface divided into a plurality of circular concentric tracks 54. Tracks 54 on all of the plates 53 which lie the same radial distance away from the centers of the plates 53 logically form a cylindrical surface referred to as a cylinder 55. Thus each track 54 of each plate 53 lies in a unique cylinder 55. Each track 54 is furthermore logically subdivided into a plurality of segments, referred to as sectors or blocks 56.

The cylinders 55, tracks 54, and sectors 56 are commonly thought of as graduations in the size of storage locations of the disk pack 50. Hence, addressing within the disk pack 50 is accomplished by specifying a cylinder 55, to select one track 54 on each plate 53, a head 57, to select one of the plates 53, and a sector 56. Further levels of graduation, i.e., subdivision of the sectors 56 into smaller identifiable storage locations, may be implemented in a conventional manner.

Figure 3:
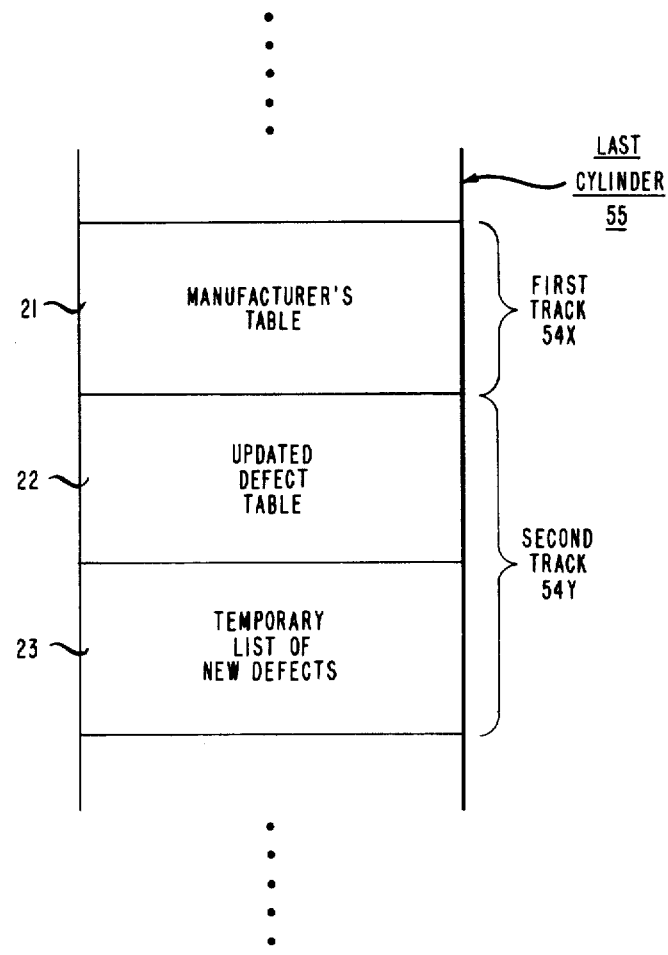
FIG. 3 is a diagram of the logical layout of a portion of a cylinder of a disk of FIG. 1.

Prior to providing the disk 13a to the user, the manufacturer of the disk 13a commonly tests it for defects. The manufacturer's specifications for the particular disk type include the maximum number of defects that the disk 13a is allowed to have. If the specified maximum number of defects is not exceeded, the disk 13a is considered to be usable. The manufacturer supplies with the disk 13a information about the disk 13a which includes the sites of the defects in the disk 13a. As shown in the example of FIG. 3, for purposes of this illustrative embodiment the manufacturer stores this information in a manufacturer's table (MT) 21 which is located on a predesignated track 54 of the disk media 50. In this example it is the first track 54X of the last cylinder 55, which cylinder 55 is reserved for use by the DFC 12 and is not available for use by jobs being run on the disk 13a.

Information stored in the manufacturer's table 21 includes addresses of defective sectors 56 in the disk media 50. The manufacturer also includes in this list of addresses a phantom address. The phantom address is a predesignated address greater than any address which any job that may be run on the disk 13a is expected to, or is allowed to, utilize. For example the phantom address may be any address greater than the addresses of any tracks 54 of any type of disk 13a that foreseeably will be used in the disk file 13. This phantom address acts as a flag to indicate the end of the list of addresses. In this illustrative example, the phantom address is made such that all bits of the binary word which defines the address are one.

For purposes of this illustrative embodiment, the manufacturer guarantees that the track 54X is defect free. In an alternative embodiment of this invention, however, if the predesignated track 54X contains a defect, instead of storing the MT 21 on the predesignated track 54X, the manufacturer flags the track 54X as defective, and then stores the MT 21 in a defect-free track 54 located elsewhere on the last cylinder 55.

The first time that the disk 13a is connected into the system 8, the DFC processor 14 is given a command to format the disk 13a. This is shown by block 60 of FIG.

5, which figure diagrams in flowchart form the steps of the disk formatting routine that pertain to this invention. The DFC processor 14 responds to the command to format the disk 13a by reading the information from the manufacturer's table 21, as shown in block 61, and converting it into whatever format is most useful for further use by the particular DFC 12 and system 8. For example, in this illustrative embodiment the DFC 12 has been directed to consider a whole track 54 defective whenever one or more of its sectors 56 is indicated to be defective. Therefore, the DFC processor 14 converts the addresses of the defective sectors 56 given in the manufacturer's table 21 into a list of corresponding track 54 addresses and eliminates therefrom plural appearances of the address of any one track 54. The DFC processor 14 also makes sure that the addresses of the defective tracks 54 are sequentially ordered. These operations are summarized in block 62. The DFC processor 14 also appends to this list the phantom address, as shown in block 63. The DFC processor 14 then stores the list of reformatted information in an updated defect table 22, as shown in block 64, which is located on the second track 54Y of the last cylinder 55, as shown in FIG. 3. When the DFC processor 14 is done formatting the updated defect table 22, it continues with conventional disk formatting functions, as shown in block 65 of FIG. 5.

As an alternative to providing the manufacturer's table 21, the disk manufacturer may merely flag sectors 56 in the disk 13a which are defective (not shown) and otherwise provide information about the disk 13a in a noncentralized manner, in which case the manufacturer's table 21 does not exist. In this case, the first time that the disk 13a is connected into the system 8, the system 8 calls upon the DFC processor 14 to cause each segment 56 of the disk pack 50 to be read to identify the flagged sectors 56 and to gather the other information, if any is provided, about the disk 13a. The information so obtained is then properly formatted, the addresses of defective storage locations are sequentially ordered, a phantom address is appended, and the formatted and ordered information is stored in the updated defect table 22 on the second track 54Y of the last cylinder 55.

The disk file 13 may be reconfigured occasionally, to better meet current service needs. For example, malfunctioning or idle disks may be removed from the disk file 13, new disks may be added to the disk file 13 to increase its storage capacity, or disks may be changed to change the information being provided to the system 8 or to reprogram the tasks assigned to the system 8. Returning to FIG. 1, upon reconfiguration of the disk file 13, the DFC 12 is initialized. The DFC 12 is provided, in a conventional manner, which information regarding the number of disks 13a through 13h that comprise the disk file 13 and the characteristics of each disk 13a through 13h. The information characterizing each disk 13a through 13h includesthetypeofo disk it is.

Figure 4:
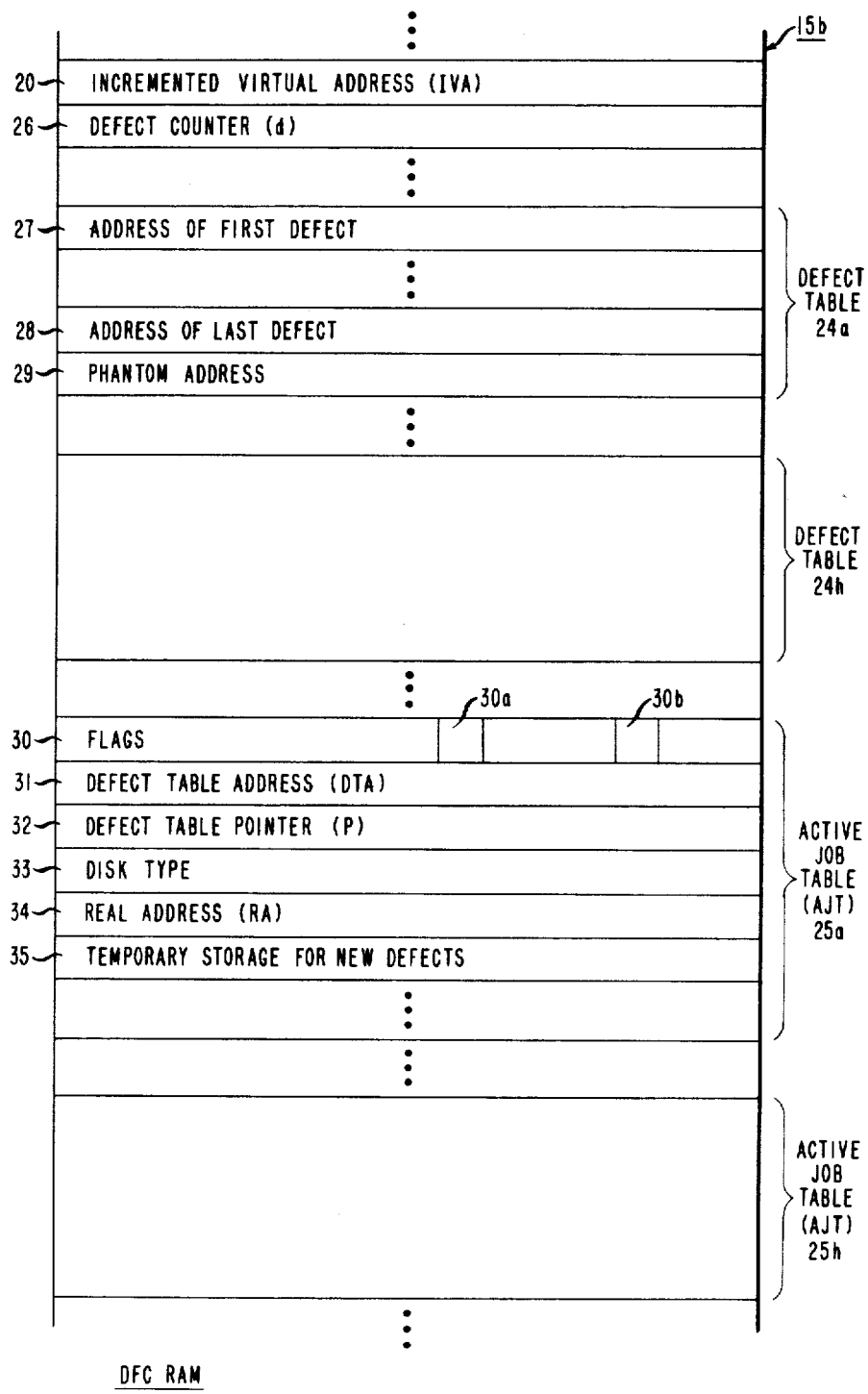
FIG. 4 is a diagram of the logical layout of a portion of the disk file controller RAM of FIG. 1.

On the basis of the information specifying the number of disks 13a through 13h and characterizing each disk 13a through 13h, the DFC processor 14 initializes the DFC RAM 15b by creating therein active job tables (AJTs) 25a through 25h, one for each disk 13a–13h, respectively, of the disk file 13, as shown in FIG. 4. Each AJT 25a through 25h is an area of the DFC RAM 15b which is logically organized by the DFC processor 14 in a predetermined manner. The AJTs 25a through 25h are duplicative of each other in organization, and therefore only the one AJT 25a associated with the disk 13a will be discussed in greater detail, with the understanding that the discussion pertains to the AJTs 25b through 25h as well.

A portion of the AJT 25 is reserved for flags 30. The DFC processor 14 causes some of the flags 30 to be set or cleared in response to the disk-characterizing and other information that was initially provided, in order to preserve this information for future use. Included among the flags 30 are a valid defect table (VDT) flag 30a and a new defect found (NDF) flag 30b, which flags the DFC processor 14 clears on initialization.

At this time the DFC processor 14 also initializes the value of an entry of the AJT 25a which entry is designated as a defect table address (DTA) 31. The DTA 31 is initialized to point to a predetermined section of the DFC RAM 15b. This section of the memory 15 is designated to hold a copy of the ordered list currently stored in the UDT 22 of the disk 13a (see FIG. 3). This copy of the ordered list is referred to as a defect table 24a. The DTA 31 contains the address of the first memory location of that predetermined section of the DFC RAM 15b, and thus serves as a pointer from the AJT 25 to the first entry of the defect table 24a.

The AJT 25 also includes an entry designated as a disk type 33, in which the DFC processor 14 stores information identifying the type of disk 13a.

Following initialization, the DFC 12 is ready to receive jobs from programs running on the CPU 11 to run on the disk file 13. A job is a command specifying, inter alia, a read or a write operation, the disk 13a through 13h to which the operation is directed, an address on the disk 13a through 13h at which the operation is to commence, and the number of consecutive sectors 56 on which the operation will be performed. Also indicated is the identity of the originator of the job, which is the identity of the program running on the CPU 11 that requested the execution of the job.

Assuming that the disk 13a through 13h being addressed by the job is the disk 13a, the newly received job is temporarily stored by the DFC processor 14 in a queue (not shown) in the DFC RAM 15b. When the disk 13a is idle, or when the disk 13a completes execution of a job and becomes idle, the DFC processor 14 gets ready to execute the new job. This is indicated by block 70 of FIG. 6, which figure diagrams in block form the defect table creation routine of the DFC processor 14. As shown by block 71, the DFC processor 14 first checks the valid defect table (VDT) flag 30a of the AJT 25a. If the flag is set, indicating that a valid defect table 24a exists in the DFC RAM 15b for the disk 13a, the DFC processor 14 continues with job execution operations, as indicated by block 75. If the flag 30a is not set, indicating that a valid defect table 24a does not exist in the DFC RAM 15b for the disk 13a, the DFC processor 14 undertakes to make one.

To form the defect table 24a in the DFC RAM 15b, the DFC processor 14 accesses the updated defect table (UDT) 22 (see FIG. 3), of the disk 13a, as shown in block 72, and transfers therefrom the ordered list of addresses into the segment of storage in the DFC RAM 15b which segment is pointed to by the DTA 31 of the AJT 25a, as shown in block 73. The defect table 24a is thus created. The DFC processor 14 also sets the valid defect table flag 30a of the AJT 25a, as shown by the block 74, to indicate that a valid defect table 24a now exists for the disk 13a. The DFC processor 14 thus becomes ready to execute the job waiting to run on the disk 13a, and it exits the table creation routine to continue with job execution operations, as shown by the block 75.

At other times when the DFC processor 14 checks the valid defect table flags 30a of other AJTs 25b–25h, it creates their defect tables 24b through 24h, respectively, in like manner.

Referring to FIG. 4, the defect table 24a comprises the ordered list of the addresses of defective tracks 54 existent in the disk media 50. The defect table 24a begins with an entry 27 designating the address of the first defective track 54 in the disk media 50 and continues with addresses of subsequent defects, down to an entry 28 which designates the address of the last defective track 54. The table 24a ends with an entry 29 which is the phantom address designating the end of the table 24a.

As was mentioned above, the information which is supplied to the DFC processor 14 as part of a job includes an address at which the job is to commence. This address is a virtual address (VA), in that it is an address within a logical spectrum of addresses that are associated with the disk 13a, but is not necessarily an address of any particular physical storage location within the disk 13a. The address of a physical storage location is referred to as a real address (RA). To associate the virtual address with a particular physical storage location, the virtual address must undergo a process of translation that modifies the virtual address and converts the virtual address into a real address. In particular, the virtual address must be compensated for the occurrence of defects in the disk pack 50. As it is not desirable to access defective storage locations, the real addresses of the defective locations cannot be assigned to any virtual addresses. For example, contiguous virtual addresses may have to be converted into noncontiguous real addresses to avoid associating the real address of a defective physical storage location with the virtual address of a valid and usable logical storage location.

Because a sector 56 is commonly considered to be a unit of storage for purposes of information storage and retrieval, the address supplied as part of the job designates a particular sector 56. However, because for purposes of defect compensation a whole track 54 is considered in this illustrative example to be defective if any of its sectors 56 are defective, the process of address translation is carried out on that portion of the address which designates a particular track 54, and the least significant bits of the job address which designate a particular sector 56 upon that track 54 are ignored, defacto truncated. Therefore, in the discussion that follows, the usage of the term address in conjunction with the translation or defect compensation process will be understood to refer to the address of a track 54.

Of course, in an alternative embodiment, such as was described above, which considers a sector 56 to be a unit of storage for defect compensation purposes as well as for information storage and retrieval purposes, the process of address translation would be carried out on the whole address that is supplied as part of the job, and the term address in the following discussion would refer to the whole, sector-designating, address.

The DFC processor 14 compensates the virtual address for defects in the disk media 50 by consulting the defect table 24a to determine which of the defective locations there listed impact the virtual address, and shifts the virtual address by the number of impacting defective locations to arrive at the real address. The process of translation causes addresses of defective storage locations to be skipped, and thus the defects which are considered to impact the virtual address are those whose addresses are exceeded by the real address which becomes associated with the virtual address.

Figure 7:
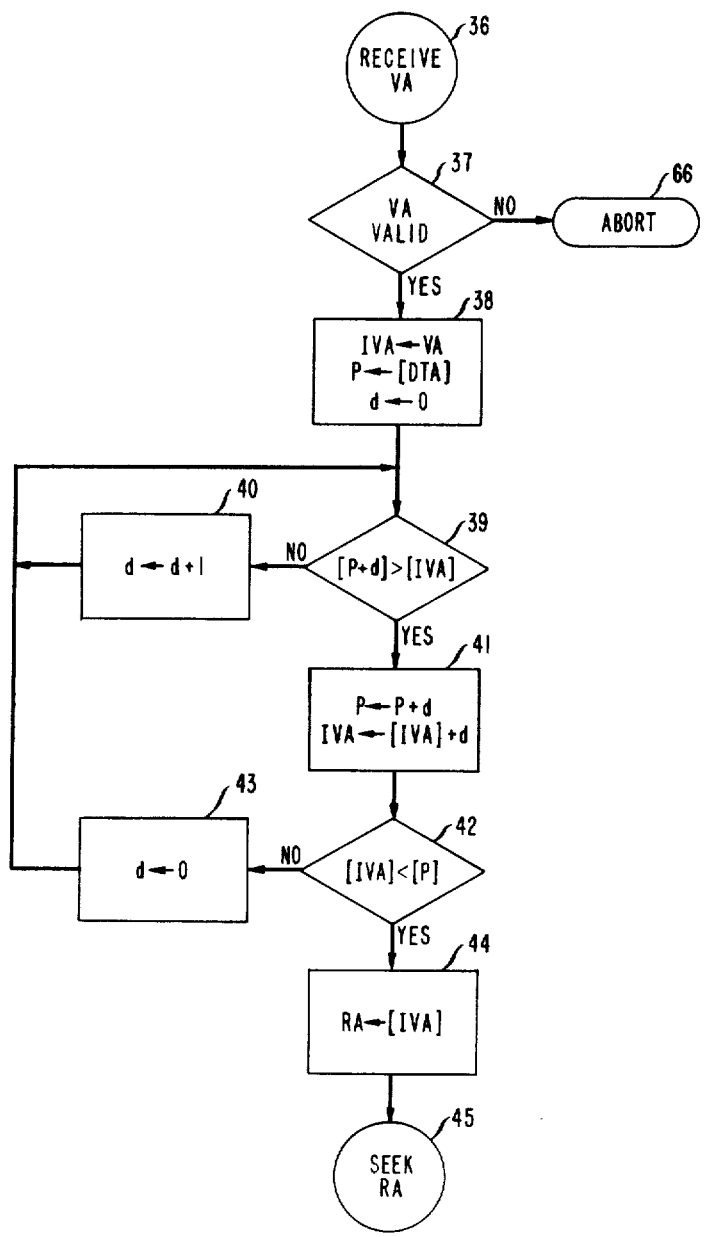
FIGS. 7 and 8 are flowcharts of address translation routines of the DFC processor of FIG. 1.

To convert the virtual address into a real address, the DFC processor 14 performs the operations flowcharted in FIG. 7. Having received the virtual address (VA), as shown in block 36, the DFC processor 14 first checks whether the address is a valid virtual address, as shown in block 37. Validity of the address is determined by whether or not the given virtual address is exceeded by the virtual address of the last storage location in the disk 13a which is available for use by a job. The address of the last available storage location in the disk media 50 is determined by the DFC processor 14 from the disk type 33 entry of the AJT 25a. If the virtual address is invalid, the DFC processor 14 aborts the job, as shown in block 66, and sends a message to the originator of the job informing it thereof.

If the virtual address is valid, the DFC processor 14 undertakes the translation thereof into a real address. As shown by block 38, the DFC processor 14 stores the virtual address in a variable referred to as an incremented virtual address (IVA) 20. The IVA 20 is a memory location in the DFC RAM 15b (see FIG. 4) which is utilized for temporary storage by the DFC controller 14. Alternatively, the IVA 20 may be a general register (not shown) within the DFC controller 14.

As further shown by the block 38, the DFC controller 14 also initializes the contents P of a defect table pointer 32 in the active job table (AJT) 25a. The defect table pointer 32 points to an entry in the defect table 24a which contains the address of the next defect that must be considered in the current translation process. As no defects have yet been considered, the defect table pointer 32 is initialized to point to the first entry 27 of the defect table 24a, by being loaded with the contents of the DTA 31. Likewise as shown in the block 38, the processor 14 also resets to zero the contents d of a defect counter 26. The defect counter 26 is a memory location in the DFC RAM 15b (see FIG. 4) which is utilized for temporary storage by the DFC processor 14. Alternatively, the defect counter 26 may be a general register (not shown) within the DFC processor 14. As will become clear from the discussion below, the counter 26 is used by the DFC processor 14 to keep count of the number of defects that impact the current value of the IVA 20 which is being translated.

As shown in block 39, the DFC processor 14 next increments the contents P of the pointer 32 by the count d of the counter 26. The DFC processor 14 uses these incremented contents of the pointer 32 as a pointer to an entry in the defect table 24a, and it compares the contents of the entry of the defect table 24a pointed to by this pointer with the contents of the IVA 20.

As the count d of the counter 26 is zero, the pointer 32 points to the first entry 27 of the defect table 24a, and the IVA 20 holds the virtual address at this point, the DFC processor 14 compares the address of the first defect in the disk media 50 with the virtual address.

If the address of the defect is greater than the contents of the IVA 20, the virtual address is not impacted by any of the defects in the disk media 50, and the DFC processor 14 performs the operations indicated by blocks 41, 42, 44 and 45.

If, however, the address of the defect is less than or equal to the contents of the IVA 20, the virtual address is impacted by the defect. In response, the DFC processor 14 increments the count d of the counter 26 by 1, as indicated by block 40, and repeats the operations indicated by the block 39 to determine if the next defect also impacts the virtual address. Hence, the virtual address is compared with the address of the second defect in the disk media 50.

The operations indicated by the blocks 39 and 40 are repeated until an entry of the defect table 24a is found which exceeds the virtual address. At this point the count d of the counter 26 indicates the number of defects that have impacted the virtual address. The DFC processor 14 then performs the operations indicated by the block 41.

As shown by the block 41, the DFC processor 14 increments the contents P of the defect table pointer 32 by the count d of the counter 26 to point the pointer 32 to the first entry of the defect table 24a which exceeds the virtual address. The DFC processor 14 also increments the IVA 20 by the count d of the counter 26 to shift the virtual address and thus compensate it for the number of defective storage locations whose real addresses precede the virtual address.

Next, the DFC processor 14 compares the incremented virtual address with the contents of the location in the defect table 24a pointed to by the contents P of the defect table pointer 32, as shown in block 42. The purpose of the comparison is to determine whether, by being shifted to compensate for the impacting defects, the virtual address came to be impacted by further subsequent defects. If the contents of the IVA 20 are exceeded by the address of the defect currently pointed to by the contents P of the pointer 32, the incremented virtual address is not impacted by further defects as a result of the shift.

If, however, the contents of the IVA 20 exceed or equal the address of the defect pointed to by the pointer 32, the incremented virtual address has encountered further defects during its shift. The DFC processor 14 therefore resets the count d of the counter 26 to zero, as indicated by block 43, and returns to perform the previously described operations starting with the block 39, to determine the number of defects that have impacted the incremented virtual address during its shift.

The series of operations indicated by the blocks 39 through 43 is repeated by the DFC processor 14 until a comparison of the incremented virtual address with the address of a defect pointed to by the contents P of the pointer 32, at the block 42, indicates that further incrementing of the virtual address has not caused it to be impacted by subsequent defects. This incremented virtual address becomes the real address (RA), as indicated by the block 44, and it is stored in an entry of the AJT 25a designated as the real address 34, as shown in FIG. 4. The DFC processor 14 ends the routine of FIG. 7 by issuing directions to the head positioning and selection circuitry 52 of the disk 13a (see FIG. 2) to seek out the track 54 in the disk media 50 which is addressed by that real address, as indicated by block 45. The DFC processor 14 then goes on to service other disks 13b-13h.

When the circuitry 52 finds the addressed track 54, it sends a signal to the DFC processor 14 to indicate that seeking has been completed. The DFC processor 14 can now access that and subsequent storage locations to execute the job.

As was mentioned above, the job may indicate that an operation be performed on a plurality of sequential, contiguous virtual locations, and hence execution of the job may span more than one track 54. As execution of the job is completed on the first track 54, and is to begin on a second track 54, the DFC processor 14 must determine whether this second track 54 is good and usable, or whether it is defective and must be skipped. If the second track 54 is good, the DFC processor 14 merely increments the real address of the first track 54 by one to obtain the real address of the second track 54. However, if the second track 54 is defective, the DFC processor 14 must increment the real address of the first track 54 by two to skip the defective second track 54 and to obtain the real address of the third track 54. If the third track 54 is also defective, the real address of the first track 54 must be incremented by three to skip the third track 54 as well, and so on, until a good track 54 is found. Since the virtual address of the second good track 54 remains unchanged and sequential with the virtual address of the first track 54 no matter how many real addresses of defective tracks are skipped inbetween, the virtual address of the second track 54 is again compensated for impacting defects by being shifted by the number of impacting defects in a manner analogous to that discussed in conjunction with FIG. 7. The above-described operation must be performed each time job execution crosses from one track 54 to another.

Figure 8:
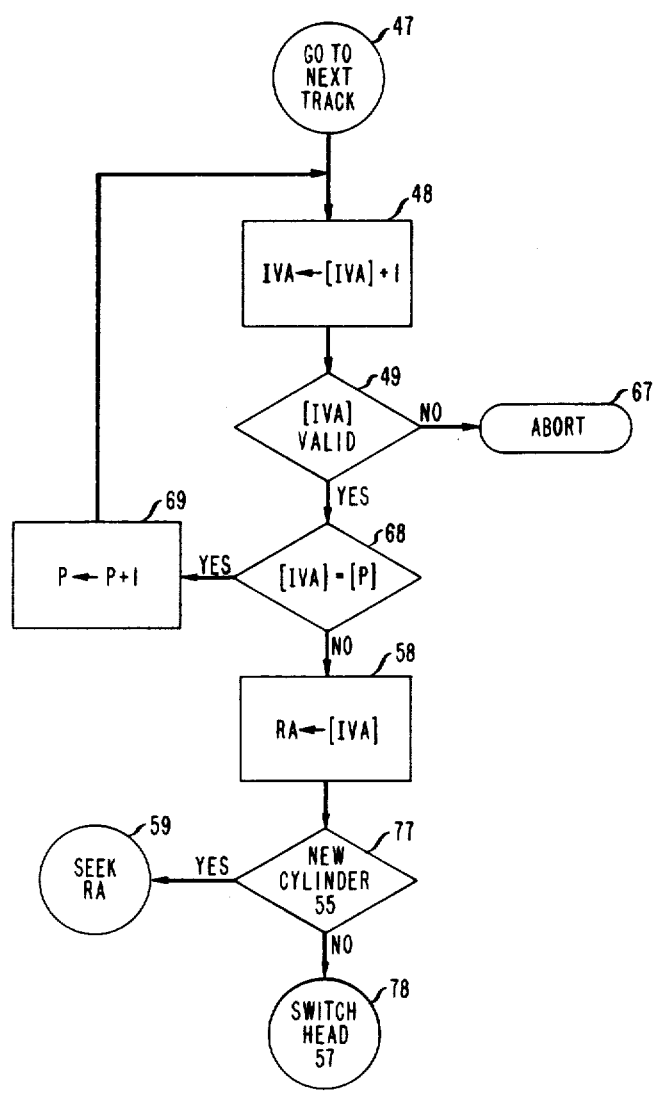

The operation of the DFC processor 14 to compensate sequential virtual addresses for defects in the disk media 50 is flowcharted in FIG. 8. When the DFC processor 14 receives an indication that job execution is to cross from one track 54 to the next track 54, as indicated by block 47, the DFC processor 14 increments the real address of the one track 54, which is stored in the IVA 20 as a result of the preceding translation process, by one, and stores this value back in the IVA 20, as indicated by the block 48. As shown in block 49, the DFC processor 14 then checks whether the address contained in the IVA 20 is a valid address, that is, whether the IVA address is exceeded by the real address of the last storage location in the disk media 50 which is available for use by a job. If the IVA address is invalid, the DFC processor 14 aborts the job, as shown in block 67, and sends a message to the originator of the job informing it thereof.

If the IVA address is valid, the DFC processor 14 undertakes the translation thereof into a real address of the next defect-free track 54. The DFC processor 14 compares the contents of the IVA 20 with the address of a defect pointed to by the contents P of the defect table pointer 32 to determine if they are equal, as indicated by block 68. If they are equal, the track 54 addressed by the contents of the IVA 20 is impacted by the defect pointed to by the pointer 32, and the track 54 is defective and must be skipped. Pursuant to this goal, the DFC processor 14 increments the contents P of the pointer 32 by one to point it to the address of the next defect in the defect table 24a, as indicated by block 69. The DFC processor 14 then repeats the operations indicated by the block 48, incrementing the contents of the IVA 20 by one to skip the defective track 54. The DFC processor 14 again checks the validity of the IVA address, as shown by the block 49, and if the address is valid compares the IVA address with the address of the defect pointed to by the pointer 32, to determine whether this track 54 is defective as well. The operations indicated by the blocks 48-49 and 67-69 are repeated by the DFC processor 14 until either the IVA address is found invalid and the job is aborted at block 67, or a track 54 is found at block 68 which is not defective.

When a defect-free track 54 is found, the IVA address becomes the real address (RA), as indicated by the block 58, and the DFC processor 14 stores the real address of this good track 54 in the real address 34 entry of the AJT 25a (see FIG. 4).

Typically, the execution of the above-described routine by the DFC processor 14 is so fast with respect to the speed of rotation of the disk media 50 that the real address of the good track 54 will have been determined before the starting point—the first sector 56—of the desired good track 54 will have passed the associated head 57. Consequently, a delay of one rotation of the disk media 50 need not typically be incurred in accessing the good track 54, and this track 54 can be accessed by the DFC processor 14 by merely causing that track's associated head 57 to be activated. An exception to this rule arises when the good track 54 lies on a cylinder 55 different from the cylinder 55 on which the previous good track 54 lies. In the latter case, repositioning of the heads 57 by the head positioning and selection circuitry 52 is required.

In consequence thereof, the DFC processor 14 determines whether the accessing of the same or a different cylinder 55 is called for, as indicated by block 77. If the same cylinder 55 as was accessed before is being accessed, the DFC processor 14 ends the routine of FIG. 8 by directing the circuitry 52 to switch heads 57, as indicated by block 78. The DFC processor 14 can then immediately access the desired track 54.

However, if a different cylinder 55 from the one accessed before is being accessed, the DFC processor 14 ends the routine of FIG. 8 by directing the head positioning and selecting circuitry 52 (see FIG. 2) to seek out this track 54, as indicated by block 59. When the circuitry 52 gives an indication to the DFC processor 14 that seeking of the track 54 is completed, the DFC processor 14 can continue execution of the job on this track 54.

Following the completion of the job and the sending of an acknowledgement thereof to the originator of the job, the DFC processor 14 becomes ready to run a new job on the disk 13a.

Subsequent to the creation of the manufacturer's table 21, new defects may appear in the disk pack 50. When the DFC processor 14 encounters a new defective location, one whose address does not appear in the defect table 24a, the DFC processor 14 is caused to execute the new defect handling routine diagramed in flowchart form in FIG. 9. When the DFC processor 14 encounters the new defective location, as indicated by block 80, the real address of this location resides in the IVA 20 (see FIG. 4) as a result of the last translation process. The DFC processor 14 compares the address of the newly found defective location with the contents of an entry of the AJT 25a which is referred to as a temporary storage for new defects (TSND) 35, as indicated by block 83, to determine whether the new defect has been encountered before.

If the new defect has not been encountered before, the DFC processor 14 takes the address of the newly found defective location from the IVA 20 and stores it in the TSND 35, as indicated by block 84. The storing of the IVA address in the TSND 35 destroys the previous contents of the TSND 35. The DFC processor 14 also sends and indication to the originator of the job that the job could not be completed because a defect was encountered, as shown in block 88. The DFC processor 14 then waits for a response from the job originator, as indicated in block 89.

In this illustrative example, the job originator directs the DTC processor 14 to reattempt the execution of the job which encountered the new defect, to make sure that what appeared before to be a defect was not merely a transient phenomenon. If the defect does not reappear, the DFC processor 14 executes the job in a conventional manner.

Figure 9:
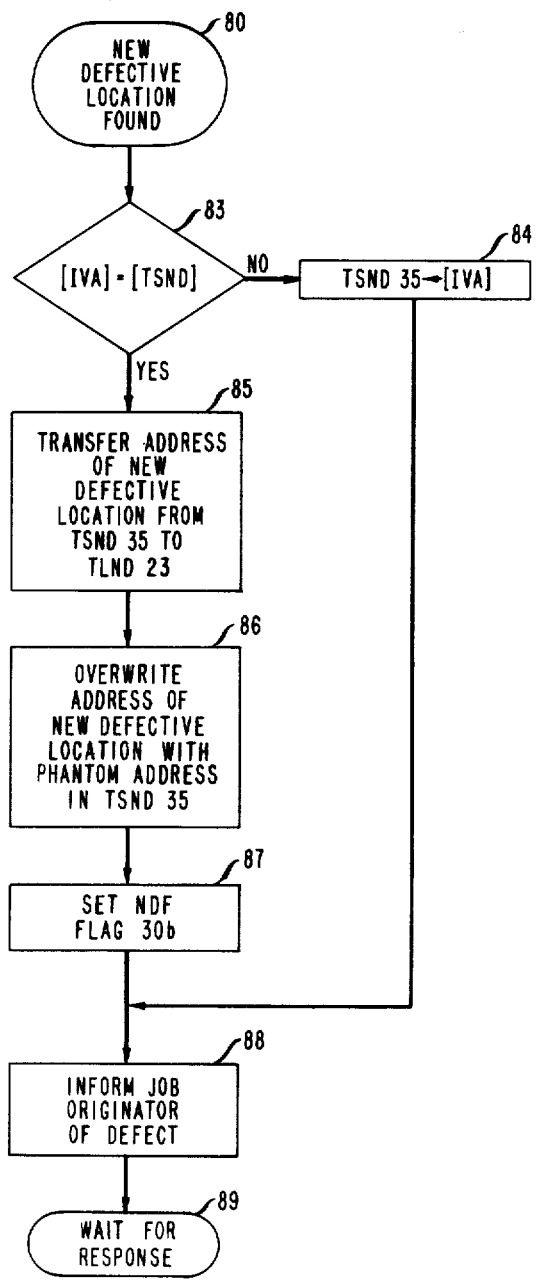
FIG. 9 is a flowchart of a new defect handling routine of the DFC processor of FIG. 1.
Figure 10:
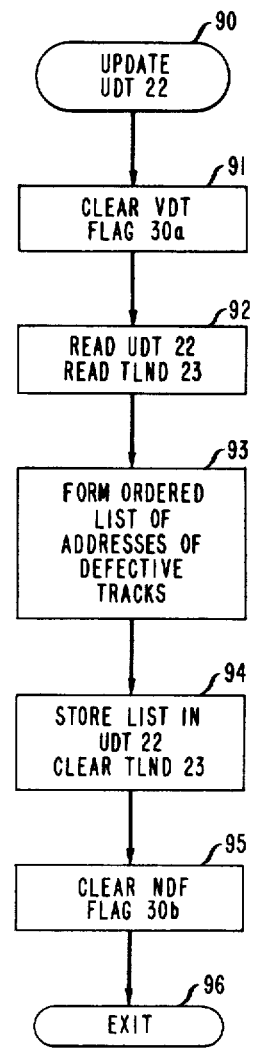
FIG. 10 is a flowchart of an updated defect table update routine of the DFC processor of FIG. 1.

If, however, the DFC processor 14 again encounters the defect, it is again caused to enter the routine of FIG. 9 at the block 80. The DFC processor 14 again compares the address of the new defective location with the contents of the TSND 35, as indicated by block 83. This time the comparison does produce a match, indicating that the defect has been encountered previously. As shown in block 85, the DFC processor 14 responds to this condition by transferring the address of the defective location from the temporary storage for new defects (TSND) 35 in the AJT 25a into a temporary list of new defects (TLND) 23 which is located in the disk 13a on the second track 54Y of the last cylinder 55 (see FIG. 3). The DFC processor 14 overwrites the address of the defect in the temporary storage for new defects 35 with the phantom address, as shown in block 86, and raises the new defect found (NDF) flag 30b in the flags 30 of the AJT 25a, as shown in block 87. The DFC processor 14 again sends an indication to the originator of the job that the job could not be completed because a defect was encountered, as shown in the block 88, and waits for a response from the job originator, as indicated in the block 89.

A decision is made by the originator of the job regarding the criticality of the job to system operation, and the DFC processor 14 is advised thereof by the job originator. If the job is not considered to be critical, the DFC processor 14 is directed to continue with the execution of other jobs. The execution of other jobs may result in additional entries being made in the TLND 23. If, however, the job is found to be critical according to some predetermined criterion, the DFC processor 14 is directed to abort all job processing operations, and the disk 13a is taken out of service.

When the disk 13a is taken out of service, i.e., when jobs cease to be run on the disk 13a, the DFC 12 may be commanded by the system to update the updated defect table (UDT) 22 of the disk 13a (see FIG. 3). This is indicated by block 90 of FIG. 10, which diagrams in flowchart from the updated defect table update routine of the DFC processor 14. The DFC processor 14 enters the updated defect table update routine and responds to the command by clearing the valid defect table (VDT) flag 30a of the AJT 25a (see FIG. 4), as shown in block 91. The DFC processor 14 then retrieves the contents of the updated defect table 22 and of the temporary list of new defects (TLND) 23 from the disk 13a, as shown in block 92. The DFC processor 14 incorporates the new defect information into the contents of the updated defect table 22, inserting the new defect information between the updated defect table 22 entries to preserve the proper sequential order of the defect addresses and thus forming a new ordered list of addresses of defective tracks, as shown in block 93. The DFC processor 14 then stores the updated information back in the updated defect table 22 and clears the temporary list of new defects 23, as shown in block 94. Thereafter the DFC processor 14 clears the new defect found (NDF)

flag 30b in the AJT 25a, as shown in block 95, and then exits the updated defect table update routine, as shown in block 96. The disk 13a is again ready for being brought back into service.

Of course, it should be understood that various changes and modifications to the illustrative embodiment described above will be apparent to those skilled in the art. For example, only a sector and not a whole track may be treated as being unusable and defective as a result of the existence of a defect therein. Or the inventive scheme may be utilized in conjunction with a storage medium other than a disk, for example a tape. Such changes and modifications can be made without departing from the spirit and the scope of the invention and without diminishing its attendant advantages. It is therefore intended that all such changes and modifications be covered by the following claims.

What is claimed is:

1. Method of accessing storage media having addressable locations and having a table of addresses of defective locations associated therewith, comprising the steps of:
   obtaining for execution of a job an address for accessing a location in the storage media;
   reading contents of the table while executing the job to determine if the access to the media will be impacted by defective locations;
   modifying the obtained address while executing the job to compensate for the impact of defective locations; and
   accessing the storage media location designated by the modified address while executing the job.

2. Method of accessing storage media having addressable locations, comprising the steps of:
   constructing a table of addresses of defective locations;
   obtaining for execution of a job an address for accessing a location in the storage media;
   reading contents of the table while executing the job to determine if the access to the media will be impacted by defective locations;
   modifying the obtained address while executing the job to compensate for the impact of defective locations; and
   accessing the storage media location designated by the modified address while executing the job.

3. Method of accessing storage media having addressable locations and having a table of addresses of defective locations associated therewith, comprising the steps of:
   obtaining for execution of a job an address for accessing a location in the storage media;
   reading contents of the table while executing the job to determine if the access to the media will be impacted by defective locations;
   modifying the obtained address while executing the job to compensate for the impact of defective locations, if at least one defective location impacts the access;
   accessing the storage media location designated by the modified address while executing the job, if at least one defective location impacts the access; and
   accessing the storage media location designated by the obtained address while executing the job, if no defective locations impact the access.

4. Method of accessing storage media having addressable locations, comprising the steps of:
   constructing a table of addresses of defective locations;
   obtaining for execution of a job an address for accessing a location in the storage media;
   reading contents of the table while executing the job to determine if access to the media will be impacted by defective locations;
   modifying the obtained address while executing the job to compensate for the impact of defective locations, if at least one defective location impacts the access;
   accessing the storage media location designated by the modified address while executing the job, if at least one defective location impacts the access; and
   accessing the storage media location designated by the obtained address while executing the job, if no defective locations impact the access.

5. The method of claim 2 or 4 wherein the step of constructing the table includes the steps of:
   retrieving from the storage media information on the sites of defects;
   converting the site information into a list of addresses of defective locations; and
   storing the list in memory means to form the table.

6. The method of claim 2 or 4 wherein the step of constructing the table includes the steps of:
   retrieving from the storage media information on the sites of defects;
   converting the site information into a list of addresses of defective locations;
   storing the list in a predetermined portion of the storage media; and
   transferring the list from the storage media into rapidly accessible memory means to form the table.

7. The method of claim 6 wherein the step of storing the list is preceded by the step of:
   appending to the list an address indicating the end of the list.

8. The method of claim 2 or 4 wherein the step of constructing the table comprises the steps of:
   retrieving a list of addresses of defective locations from a predetermined portion of the storage media; and
   transferring the list into rapidly accessible memory means to form the table.

9. The method of claim 8 wherein the step of retrieving the list includes the step of:
   retrieving an address included in the list indicative of the end of the list.

10. The method of claim 1 or 2 or 3 or 4 wherein the step of reading contents of the table includes the steps of:
    selecting an address from the table; and
    comparing the selected address with the obtained address to determine whether the selected address impacts the access to the media.

11. The method of claim 1 or 2 or 3 or 4 wherein the addresses in the table are ordered and wherein the step of reading contents of the table includes the steps of:
    selecting a location in the table;
    accessing the table to read out the address from the selected location;
    comparing the read-out address with the obtained address to determine whether the read-out address impacts access to the media at the obtained address; and
    repeating the preceding two steps for addresses read out from the table in the order in which they are stored in the table while the read-out addresses impact access at the obtained address.

12. The method of claim 1 or 2 or 3 or 4 wherein the steps of modifying the obtained address comprises the steps of:
  determining the number of impacting defective locations; and
  shifting the obtained address by the number of impacting defective locations.

13. The method of claim 1 or 2 or 3 or 4 wherein the step of modifying the obtained address comprises the steps of:
  determining the number of impacting defective locations; and
  incrementing the obtained address by the number of impacting defective locations.

14. The method of claim 1 or 2 or 3 or 4 wherein the addresses in the table are ordered and wherein the step of reading contents of the table comprises the steps of:
  comparing addresses in the table with the obtained address; and
  determining the number of addresses in the table which do not exceed the obtained address.

15. The method of claim 1 or 2 or 3 or 4 wherein the addresses in the table are ordered, and wherein the steps of reading contents of the table and of modifying the obtained address comprise the steps of:
  making an incremented address equal to the obtained address;
  selecting the first location in the table;
  accessing the table to read out the address from the selected location;
  comparing the read-out address with the incremented address to determine whether the read-out address exceeds the incremented address;
  selecting the next location in the table and returning to the step of accessing the table, when the read-out address does not exceed the incremented address, to determine the number of addresses in the table that do not exceed the incremented address;
  incrementing the incremented address by the number of addresses in the table that do not exceed the obtained address and returning to the step of accessing the table, when the number is nonzero; and
  generating a modified address equal to the incremented address.

16. The method of claim 15 further comprising the steps of:
  obtaining for execution of the job a second address, contiguous with the address of the accessed location, for accessing of a second location in the storage media;
  making the incremented address equal to the second obtained address, while executing the job;
  selecting the last previously selected location in the table, while executing the job;
  accessing the table while executing the job to read out the address from the selected location;
  comparing the read-out address with the incremented address, while executing the job, to determine whether the read-out address equals the incremented address;
  incrementing the incremented address, selecting the next location in the table, and returning to the step of accessing the table, while executing the job, when the read-out address equals the incremented address;
  generating a second modified address equal to the incremented address, while executing the job; and
  accessing the storage media location designated by the second modified address while executing the job.

17. The method of claim 1 or 2 or 3 or 4 further comprising the steps of:
  determining that a new location is defective;
  generating the address of the new defective location; and
  updating the table with the address of the new defective location.

18. The method of claim 17 wherein the step of updating the table comprises the steps of:
  storing the address of the new defective location in temporary storage means;
  checking the new defective location to determine whether it continues to be defective; and
  transferring the address of the new defective location from the temporary storage means into the table if the new defective location continues to be defective.

19. Method of avoiding accessing of defective locations in storage media having addressable locations, comprising the steps of:
  constructing an ordered table of addresses of defective locations;
  obtaining for execution of a job a virtual address for accessing a location in the storage media;
  reading contents of the table while executing the job to determine the number of defective locations that will impact the access to the media;
  translating the obtained virtual address into a real address, while executing the job, using in the translation the determined number of defective locations; and
  accessing the storage media location designated by the real address, while executing the job.

20. The method of claim 19 wherein the step of constructing the table includes the steps of:
  retrieving from the storage media information on the sites of defects;
  converting the site information into addresses of defective locations;
  arranging the addresses into a sequentially ordered list; and
  storing the list in memory means to form the table.

21. The method of claim 19 wherein the step of constructing the table includes the steps of:
  retrieving from the storage media information on the sites of defects;
  converting the site information into a list of addresses of defective locations;
  arranging the addresses into a sequentially ordered list;
  storing the list in a predetermined portion of the storage media; and
  transferring the list from the storage media into rapidly accessible memory means to form the table.

22. The method of claim 21 wherein the step of storing the list is preceded by the step of:
  appending to the list an address indicating the end of the list.

23. The method of claim 19 wherein the step of constructing the table comprises the steps of:
  retrieving a sequentially ordered list of addresses of defective locations from a predetermined portion of the storage media; and transferring the list into rapidly accessible memory means to form the table.

24. The method of claim 23 wherein the step of retrieving the list includes the step of:
   retrieving an address included in the list indicative of the end of the list.

25. Method of avoiding accessing of defective locations in storage media having addressable locations, and having an ordered table of addresses of defective locations associated therewith, the method comprising the steps of:
   obtaining for execution of a job a virtual address for accessing a location in the storage media;
   reading contents of the table while executing the job to determine the number of defective locations that will impact the access to the media;
   translating the obtained virtual address into a real address, while executing the job, using in the translation the determined number of defective locations; and
   accessing the storage media location designated by the real address, while executing the job.

26. The method of claim 19 or 25 wherein the step of reading contents of the ordered table includes the steps of:
   selecting an address from the table; and
   comparing the selected address with the virtual address to determine whether the selected address impacts the access to the media.

27. The method of claim 19 or 25 wherein the step of reading contents of the table includes the steps of:
   selecting a location in the table;
   accessing the table to read out the address from the selected location;
   comparing the read-out address with the virtual address to determine whether the read-out address impacts access to the media at the virtual address; and
   repeating the preceding two steps for addresses read out from the table in the order in which they are stored in the table while the read-out addresses impact the access.

28. The method of claim 19 or 25 wherein the step of reading contents of the table comprises the steps of:
   comparing addresses in the table with the virtual address; and
   determining the number of addresses in the table which do not exceed the virtual address.

29. The method of claim 28 wherein the step of translating the virtual address comprises the step of:
   shifting the virtual address by the number.

30. The method of claim 28 wherein the step of translating the virtual address comprises the step of:
   incrementing the virtual address by the number.

31. The method of claim 19 or 25 wherein the steps of reading contents of the table and of translating the virtual address comprise the steps of:
   making a shifted address equal to the virtual address;
   selecting the first location in the table;
   accessing the table to read out the address from the selected location;
   comparing the read-out address with the shifted address to determine whether the read-out address exceeds the shifted address;
   selecting the next location in the table and returning to the step of accessing the table, when the read-out address does not exceed the shifted address, to determine the number of addresses in the table that do not exceed the shifted address;
   shifting the shifted address by the number of addresses in the table that do not exceed the shifted address and returning to the step of accessing the table, when the number is nonzero; and
   generating a real address equal to the shifted address.

32. The method of claim 31 wherein the step of shifting the shifted address comprises the step of incrementing the shifted address by the number.

33. The method of claim 31 further comprising the steps of:
   obtaining for execution of the job a second virtual address, contiguous with the real address, for accessing a second location in the storage media;
   making an incremented address equal to the second virtual address, while executing the job;
   selecting the last previously selected location in the table, while executing the job;
   accessing the table while executing the job to read out the address from the selected location;
   comparing the read-out address with the incremented address, while executing the job, to determine whether the read-out address equals the incremented address;
   incrementing the incremented address, selecting the next location in the table, and returning to the step of accessing the table, while executing the job, when the read-out address equals the incremented address;
   generating a second real address equal to the incremented address, while executing the job; and
   accessing the storage media location designated by the second real address, while executing the job.

34. The method of claim 19 or 25 further comprising the steps of:
   determining that a new location is defective;
   generating the address of the new defective location; and
   updating the table with the address of the new defective location.

35. The method of claim 34 wherein the step of updating the table comprises the steps of:
   storing the address of the new defective location in temporary storage means;
   checking the new defective location to determine whether it continues to be defective; and
   transferring the address of the new defective location from the temporary storage means into the table if the new defective location continues to be defective.

36. Apparatus for accessing storage media having addressable locations and having a table of addresses of defective locations associated therewith, comprising:
   means for obtaining for execution of a job an address for accessing a location in the storage media;
   means for reading contents of the table during execution of the job to determine if the access to the media will be impacted by defective locations;
   means for modifying the obtained address during execution of the job to compensate for the impact of defective locations; and
   means for accessing during execution of the job the storage media location designated by the modified address.

37. Apparatus for accessing storage media having addressable locations, comprising:

means for constructing a table of addresses of defective locations;
means for obtaining for execution of a job an address for accessing a location in the storage media;
means for reading contents of the table during execution of the job to determine if the access to the media will be impacted by defective locations;
means for modifying the obtained address during execution of the job to compensate for the impact of defective locations; and
means for accessing during execution of the job the storage media location designated by the modified address.

38. The apparatus of claim 37 wherein the means for constructing the table comprise:
memory means;
means for determining the addresses of the defective locations; and
means for storing the addresses in the memory means.

39. The apparatus of claim 37 wherein the means for constructing the table comprise:
rapidly accessible memory means;
means for obtaining a list of addresses of defective locations from a predetermined portion of the storage media; and
means for transferring the list into the rapidly accessible memory means to form the table.

40. The apparatus of claim 37 wherein the list concludes with an address indicating the end of the list.

41. The apparatus of claim 36 or 37 wherein the means for reading contents of the table include:
means for selecting an address from the table; and
means for comparing the selected address with the obtained address to determine whether the selected address impacts the access to the media.

42. The apparatus of claim 36 or 37 wherein the means for modifying the obtained address comprise:
means for determining the number of impacting defective locations; and
means for shifting the obtained address by the number of impacting defective locations.

43. The apparatus of claim 36 or 37 wherein the means for modifying the obtained address comprise:
means for determining the number of impacting defective locations; and
means for incrementing the obtained address by the number of impacting defective locations.

44. The apparatus of claim 36 or 37 wherein the addresses in the table are ordered and wherein the means for reading contents of the table comprise:
means for comparing addresses in the table with the obtained address; and
means for determining the number of addresses in the table which do not exceed the obtained address.

45. The apparatus of claim 36 or 37 further comprising:
means for determining that a new location is defective;
means for generating the address of the new defective location; and
means for updating the table with the address of the new defective location.

46. Apparatus for avoiding accessing of defective locations in storage media having addressable locations, comprising:
means for constructing an ordered table of addresses of defective locations;
means for obtaining for execution of a job a virtual address for accessing a location in the storage media;
means for reading contents of the table during execution of the job to determine the number of defective locations that will impact the access to the media;
means for translating the obtained virtual address into a real address during execution of the job, using in the translation the determined number of defective locations; and
means for accessing during execution of the job the storage media location designated by the real address.

47. Apparatus for avoiding accessing of defective locations in storage media having addressable locations, and having an ordered table of addresses of defective locations associated therewith, the apparatus comprising:
means for obtaining for execution of a job a virtual address for accessing a location in the storage media;
means for reading contents of the table during execution of the job to determine the number of defective locations that will impact the access to the media;
means for translating the obtained virtual address into a real address during execution of the job, using in the translation the determined number of defective locations; and
means for accessing during execution of the job the storage media location designated by the real address.

48. The apparatus of claim 46 wherein the table constructing means comprise:
memory means;
means for determining the addresses of the defective locations; and
means for storing the addresses is sequential order in the memory means.

49. The apparatus of claim 46 wherein the means for constructing the table comprise:
rapidly accessible memory means;
means for obtaining a sequentially ordered list of addresses of defective locations from a predetermined portion of the storage media; and
means for transferring the list into the rapidly accessible memory means to form the table.

50. The apparatus of claim 49 wherein the list concludes with an address indicating the end of the list.

51. The apparatus of claim 46 or 47 wherein the means for reading contents of the ordered table include:
means for selecting an address from the table; and
means for comparing the selected address with the virtual address to determine whether the selected address impacts the access to the media.

52. The apparatus of claim 46 or 47 wherein the means for reading contents of the table comprise:
means for comparing addresses in the table with the virtual address; and
means for determining the number of addresses in the table which do not exceed the virtual address.

53. The apparatus of claim 52 wherein the means for translating the virtual address comprise:
means for shifting the virtual address by the number.

54. The apparatus of claim 53 wherein the means for translating the virtual address comprise:

means for incrementing the virtual address by the number.

55. The apparatus of claim 46 or 47 further comprising:

means for determining that a new location is defective;
means for generating the address of the new defective location; and
means for updating the table with the address of the new defective location.

* * * * *

UNITED STATES PATENT AND TRADEMARK OFFICE
CERTIFICATE OF CORRECTION

PATENT NO. : 4,498,146

DATED : February 5, 1985

INVENTOR(S) : Maria N. Martinez

It is certified that error appears in the above-identified patent and that said Letters Patent is hereby corrected as shown below:

```
Column 5, line 57, after "13h" "includesthetypeofo"
  should be --includes the type of--.
Column 12, line 50, after "flowchart" "from" should
  be --form--.
Column 15, line 4, "steps" should be --step--.
Column 20, line 40, after "addresses" "is" should
  be --in--.
```

Signed and Sealed this

Thirteenth Day of August 1985

[SEAL]

Attest:

DONALD J. QUIGG

*Attesting Officer*     *Acting Commissioner of Patents and Trademarks*